United States Patent
Choi et al.

(10) Patent No.: US 12,131,978 B2
(45) Date of Patent: Oct. 29, 2024

(54) SEMICONDUCTOR DEVICE WITH HIGH HEAT DISSIPATION PROPERTY USING HEXAGONAL BORON NITRIDE AND METHOD OF MANUFACTURING THE SAME

(71) Applicant: Electronics and Telecommunications Research Institute, Daejeon (KR)

(72) Inventors: Il Gyu Choi, Jeonju-si (KR); Seong Il Kim, Daejeon (KR); Hae Cheon Kim, Daejeon (KR); Youn Sub Noh, Daejeon (KR); Ho Kyun Ahn, Daejeon (KR); Sang Heung Lee, Daejeon (KR); Jong Won Lim, Daejeon (KR); Sung Jae Chang, Daejeon (KR); Hyun Wook Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 164 days.

(21) Appl. No.: 17/562,587

(22) Filed: Dec. 27, 2021

(65) Prior Publication Data
US 2022/0285244 A1 Sep. 8, 2022

(30) Foreign Application Priority Data

Mar. 8, 2021 (KR) .................. 10-2021-0030059
Oct. 27, 2021 (KR) .................. 10-2021-0144781

(51) Int. Cl.
*H01L 23/373* (2006.01)
*H01L 33/64* (2010.01)

(52) U.S. Cl.
CPC ...... *H01L 23/3738* (2013.01); *H01L 23/3731* (2013.01)

(58) Field of Classification Search
CPC ........ H01L 23/3738; H01L 33/64–648; H10K 50/87
See application file for complete search history.

(56) References Cited

U.S. PATENT DOCUMENTS 8,691,627 B2  4/2014  Won
9,490,198 B1  11/2016  Eom
(Continued)

FOREIGN PATENT DOCUMENTS

JP  6-105779  12/1994
JP  2012-144767  8/2012
(Continued)

OTHER PUBLICATIONS

Seok Jin Bhang et al.; "Boron Nitride-Based Paint with High Heat Dissipation Performance"; Phys. Status Solidi A. 2019; 216; 6 pages.
(Continued)

*Primary Examiner* — Walter H Swanson
*Assistant Examiner* — Jacob T Nelson
(74) *Attorney, Agent, or Firm* — KILE PARK REED & HOUTTEMAN PLLC

(57) ABSTRACT

The present invention improves a heat dissipation property of a semiconductor device by transferring hexagonal boron nitride (hBN) with a two-dimensional nanostructure to the semiconductor device. A semiconductor device of the present invention includes a substrate having a first surface and a second surface, a semiconductor layer formed on the first surface of the substrate, an hBN layer formed on at least one surface of the first surface and the second surface of the substrate, and a heat sink positioned on the second surface of the substrate. A radiation rate of heat generated during driving of an element is increased to decrease a reduction in lifetime of a semiconductor device due to a temperature (Continued)

increase. The semiconductor device has a structure and configuration which are very effective in improving a rapid temperature increase due to heat generated by high-power semiconductor devices.

17 Claims, 5 Drawing Sheets
(1 of 5 Drawing Sheet(s) Filed in Color)

(56) References Cited

U.S. PATENT DOCUMENTS

| | | | |
|---|---|---|---|
| 9,596,788 B1* | 3/2017 | Lai | H01L 23/3731 |
| 9,698,043 B1* | 7/2017 | Chan | H01L 21/3065 |
| 2002/0105071 A1* | 8/2002 | Mahajan | H01L 23/36 |
| | | | 257/E23.101 |
| 2011/0204409 A1* | 8/2011 | Sung | H05K 1/0203 |
| | | | 165/185 |
| 2021/0375766 A1* | 12/2021 | Tung | H01L 23/5386 |

FOREIGN PATENT DOCUMENTS

| | | |
|---|---|---|
| JP | 2016-192497 | 11/2016 |
| KR | 10-2018-0096098 | 8/2018 |

OTHER PUBLICATIONS

Atsushi Yokoi et al.; "Design of Heat-Conductive hBN-PMMA Composites by Electrostatic Nano-Assembly"; Nanomaterials; 2020; 10; 134; pp. 2-9.

* cited by examiner

SEMICONDUCTOR DEVICE WITH HIGH HEAT DISSIPATION PROPERTY USING HEXAGONAL BORON NITRIDE AND METHOD OF MANUFACTURING THE SAME

CROSS-REFERENCE TO RELATED APPLICATIONS

This application claims priority to and the benefit of Korean Patent Application Nos. 10-2021-0030059, filed Mar. 8, 2021 and 10-2021-0144781, filed Oct. 27, 2021, the disclosures of which are incorporated herein by reference in their entirety.

BACKGROUND

1. Field of the Invention

The present invention relates to a semiconductor device with a high heat dissipation property, and more particularly, to a semiconductor device using hexagonal boron nitride (hBN) with a two-dimensional nanostructure as a heat dissipation medium.

2. Discussion of Related Art

As heat dissipation parts of conventional semiconductor devices, aluminum- or copper-based heat dissipation materials, which are bulky and vulnerable to distortion, or fans have been used. Recently, an electrical insulation property of hexagonal boron nitride (hBN) with a two-dimensional nanostructure has been used for an insulator in a transistor structure to improve the quality of an insulating layer. Recently, it has been reported that, due to high thermal conductivity of hBN, hBN is used as a heat dissipation material for elements in various fields.

Since hBN has a nanostructure, hBN has a relatively small volume and high durability against bending. In addition, in theory, heat generated inside a semiconductor device having a high thermal conductivity of 2,000 W/mK can be distributed or radiated to the outside at a high speed, thereby improving a photoelectric property of the semiconductor device.

SUMMARY OF THE INVENTION

A semiconductor device, to which hexagonal boron nitride (hBN) with a nanostructure is applied, will present the possibility of a micro-semiconductor device with a small volume and an improved heat dissipation property and will bring a decrease in reduction of a lifetime of a semiconductor device and an improved power output performance of a high-power semiconductor device. Thus, the present invention is directed to improving a heat dissipation property of a semiconductor device by applying hBN with a nanostructure.

To achieve the objective, in order to get a structure capable of effectively distributing or dissipating heat generated during operation of a semiconductor device, a single or multi-layered hBN nanostructure having high thermal conductivity is transferred onto a rear surface or inside of a light-emitting diode (LED) device or a field-effect transistor (FET) device and used as a heat dissipation medium, thereby reducing heat generated during operation of the semiconductor device and decreasing reductions in efficiency and lifetime of the semiconductor device due to heat The semiconductor device may include a bulk, thin film, quantum well, nano wire, or quantum dot structure.

The semiconductor device may have a single structure or a mixture of two or more structures.

The semiconductor layer may include at least one selected from among atoms of Groups II, III, IV, and V.

The semiconductor layer may include a compound formed by bonding zinc to oxygen or selenide or a compound formed by bonding aluminum, gallium, or indium to nitrogen, arsenic, or phosphorus.

The semiconductor device may include ZnO, ZnSe, AlN, AlGaN, GaN, InAlGaN, InGaN, InN, AlAs, AlGaAs, GaAs, InAlGaAs, InGaAs, InAs, AlGaP, AlGaAsP, InAlGaAsP, or InGaAsP.

An hBN layer may include 1 to 100 layers of hBN.

The hBN layer may have a thickness of 10 Å to 200 nm.

The above-described configurations and operations of the present invention will become more apparent from embodiments described in detail below with reference to the accompanying drawings.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

The advantages and features of the present invention and methods for accomplishing the same will be more clearly understood from embodiments to be described in detail below with reference to the accompanying drawing. However, the present invention is not limited to the following embodiments but may be implemented in various different forms. Rather, these embodiments are provided only to complete the disclosure of the present invention and to allow those skilled in the art to understand the category of the present invention. The present invention is defined by the category of the claims. In addition, terms used in this specification are to describe the embodiments and are not intended to limit the present invention. As used herein, singular expressions, unless defined otherwise in context, include plural expressions. It will be further understood that the terms "comprises," "comprising," "includes," and/or "including," when used herein, specify the presence of elements, steps, operations, and/or components (or parts), which are stated as XX, but do not preclude the presence or addition of one or more other elements, steps, operations, and/or components (or parts).

Hereinafter, exemplary embodiments of the present invention will be described in detail with reference to the accompanying drawings. Moreover, in describing the embodiments, detailed descriptions related to well-known functions or configurations will be ruled out in order not to unnecessarily obscure subject matters of the present invention.

Figure 1:
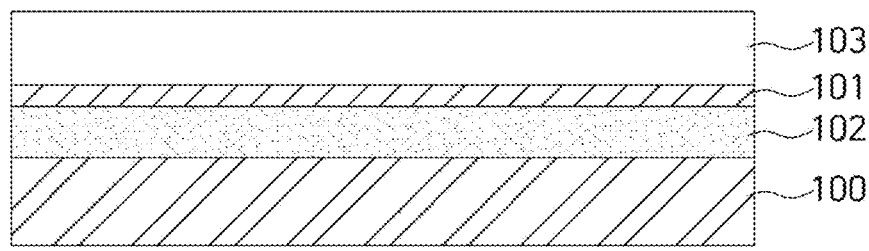
FIGS. 1 to 3 are views illustrating layered structures of a semiconductor device according to one embodiment of the present invention.
Figure 2:
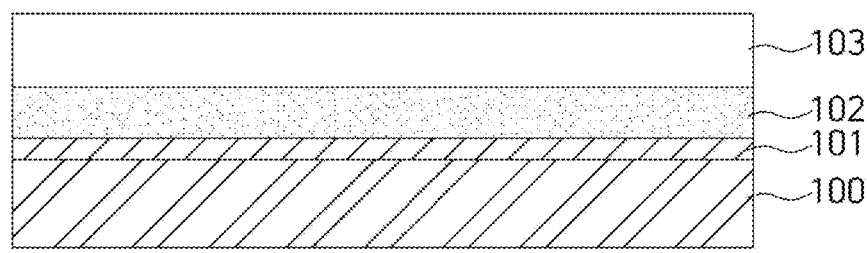
Figure 3:
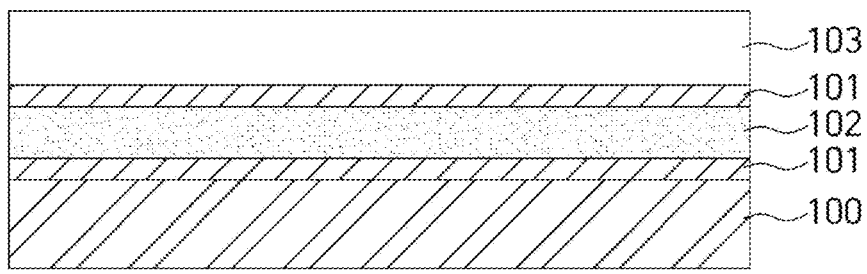

FIGS. 1 to 3 illustrate layered structures of a semiconductor device according to one embodiment of the present invention.

Referring to FIG. 1, a hexagonal boron nitride (hBN) layer 101 is disposed on a substrate 102, and a semiconductor layer 103 is formed thereon. A heat sink 100 is attached to a lower portion of the substrate 102.

In the embodiment shown in FIG. 2, the semiconductor layer 103 is formed on the substrate 102. The hBN layer 101 is disposed on a rear surface (lower surface) of the substrate 102, and the heat sink 100 is attached thereto.

In the embodiment shown in FIG. 3, the hBN layer 101 is disposed on the substrate 102, and the semiconductor layer 103 is formed thereon. The hBN layer 101 is also provided under the substrate 102, and the heat sink 100 is attached thereto.

Figure 4:
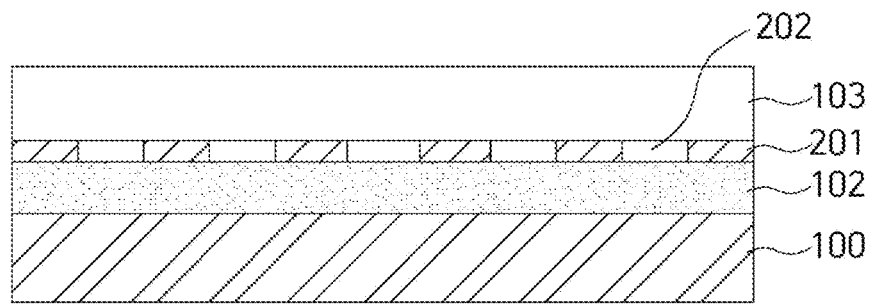
FIGS. 4 to 6 are views illustrating layered structures of a semiconductor device according to another embodiment.
Figure 5:
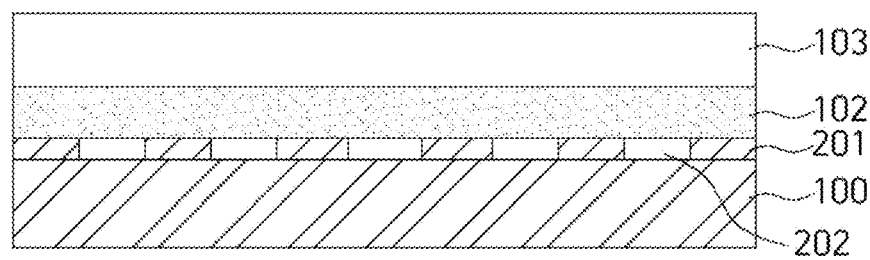
Figure 6:
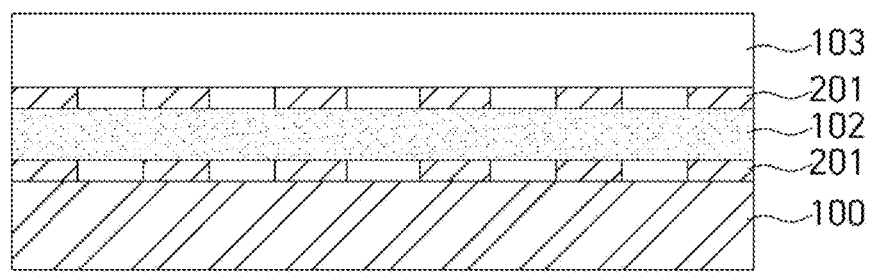

FIGS. 4 to 6 illustrate layered structures of a semiconductor device according to another embodiment.

Referring to FIG. 4, multi-hBN-regions layer 201 and 202 are disposed on a substrate 102, and a semiconductor layer 103 is formed thereon. A heat sink 100 is attached to a rear surface (lower surface) of the substrate 102. Here, the multi-hBN-regions layer 201 and 202 mean that single- or multi-layered hBN regions 201 are laterally disposed on a surface of the substrate with insulating regions 202 interposed therebetween. FIG. 4 is a vertical cross-sectional view illustrating a concept, and although the insulating regions 202 and the multi-hBN-regions layer 201 and 202 are illustrated as being uniformly positioned in a predetermined shape, in practice the multi-hBN-regions layer 201 and 202 may be non-uniformly disposed in various shapes.

In the embodiment shown in FIG. 5, the semiconductor layer 103 is formed on the substrate 102. The multi-hBN-regions layer 201 and 202 are disposed under the substrate 102, and the heat sink 100 is attached thereto.

In the embodiment shown in FIG. 6, the multi-hBN-regions layer 201 and 202 are disposed on the substrate 102, and the semiconductor layer 103 is formed thereon. The multi-hBN-regions layer 201 and 202 are also provided under the substrate 102, and the heat sink 100 is attached thereto.

In configurations of FIGS. 1 to 6, the hBN layer 101 or multi-hBN-regions layer 201 and 202 have a two-dimensional nanostructure, and as described above, the hBN layer 101 or multi-hBN-regions layer 201 and 202 serve as a heat dissipation medium which assists in radiating heat separately from the heat sink 100 or together with the heat sink 100. As described above, the hBN layer 101 or the multi-hBN-regions layer 201 and 202 may be positioned on an upper portion or a lower portion of the substrate 102 or may be positioned on both the upper and lower portions of the substrate 102.

Here, the heat sink 100 may be made of a metal or ceramic-based material.

The hBN layer 101 or multi-hBN-regions layer 201 and 202 have a single crystalline or polycrystalline structure.

A transfer method may be used to dispose the hBN layer 101 or multi-hBN-regions layer 201 and 202 on the substrate 102. That is, the hBN layer 101 or multi-hBN-regions layer 201 and 202 may be transferred onto the substrate 102 first, and then the semiconductor layer 103 may be formed thereon, the semiconductor layer 103 may be formed on a front surface of the substrate 102, and then the hBN layer 101 or multi-hBN-regions layer 201 and 202 may be transferred onto a rear surface of the substrate 102, or the hBN layer 101 or multi-hBN-regions layer 201 and 202 may be transferred onto the front surface of the substrate 102 first, the semiconductor layer 103 may be formed thereon, and then, the hBN layer 101 or multi-hBN-regions layer 201 and 202 may be transferred onto the rear surface of the substrate 102.

Each of the hBN layer 101 or the multi-hBN-region layer 201 and 202 may be a single hBN layer, or may be multi-layered hBN in which a plurality of layers are stacked (for example, 100 layers).

Each of the hBN layer 101 or the multi-hBN-regions layer 201 and 202 may have a thickness of 10 Å to 200 nm, and the performance thereof as a heat dissipation medium varies according to the thickness thereof. This will be described in Experimental Examples below.

The semiconductor layer 103 may be an optoelectronic semiconductor (for example, an LED) including atoms of Groups II, III, IV, and/or V. In addition, the semiconductor layer 103 may include one or more optoelectronic semiconductors having a bulk, thin film, quantum well, nano wire, or quantum dot structure.

The semiconductor layer 103 may include a compound formed by bonding zinc to oxygen or selenide, or a compound formed by bonding aluminum, gallium, or indium to nitrogen, arsenic, or phosphorus (for example, aluminum nitride (AlN), aluminum gallium nitride (AlGaN), gallium nitride (GaN), indium aluminum gallium nitride (InAlGaN), indium gallium nitride (InGaN), indium nitride (InN), aluminum arsenide (AlAs), aluminum gallium arsenide (AlGaAs), gallium arsenide (GaAs), indium aluminum gallium arsenide (InAlGaAs), indium gallium arsenide (InGaAs), indium arsenide (InAs), aluminum gallium phosphide (AlGaP), aluminum gallium arsenide phosphide (AlGaAsP), indium aluminum gallium arsenide phosphide (InAlGaAsP), or indium gallium arsenide phosphide (InGaAsP)).

<Effect Verification>

In order to verify effects of the present invention, two types of LED element packages were manufactured.

Figure 7:
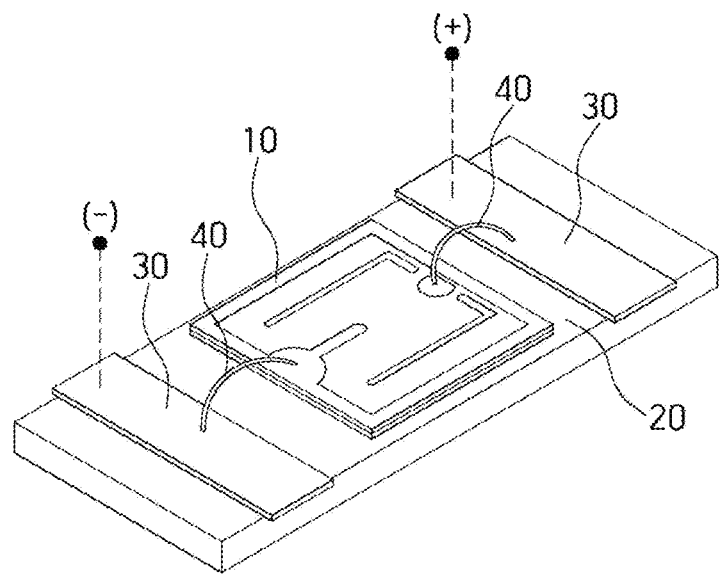
FIG. 7 is a schematic view of a blue LED package manufactured on a glass according to the present invention.

FIG. 7 illustrates a semiconductor device package with a high heat dissipation property, which is manufactured by attaching each blue LED 10, in which an hBN layer 101 (see FIGS. 1 to 6) is transferred to a thickness of 10 nm, 20 nm, or 30 nm on a rear surface of a substrate 102 (see FIGS. 1 to 6), to glass 20 without a heat sink 100 (see FIGS. 1 to 10) and connecting the blue LED 10 to an electrode 30 through a bonding wire 40.

Figure 8:
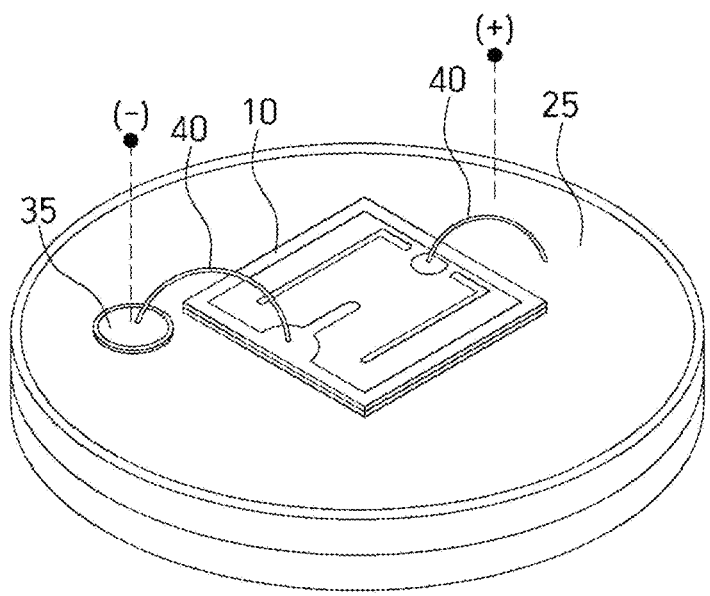
FIG. 8 is a schematic view of a blue LED package manufactured on a copper heat sink according to the present invention.

FIG. 8 illustrates a semiconductor device package with a high heat dissipation property, which is manufactured by connecting each blue LED 10, in which an hBN layer is transferred to a thickness of 10 nm, 20 nm, or 30 nm on a rear surface of a substrate 102 (see FIGS. 1 to 6) and a Cu heat sink 25 is attached, to an electrode 35 through a bonding wire 40.

A heat dissipation property experiment was performed on three LED packages (including hBN layers with thicknesses of 10 nm, 20 nm, and 320) manufactured as shown in FIG.

7 according to the present invention, three LED packages (including hBN layers with thicknesses of 10 nm, 20 nm, and 320) manufactured as shown in FIG. 8 according to the present invention, an LED package without an hBN layer having the same condition corresponding to that of the package of FIG. 7, and an LED package without an hBN layer having the same condition corresponding to that of the package of FIG. 8. An electric current was supplied to each LED package to drive the package, and heat distribution emitted from an LED was photographed for 300 seconds using a thermal imaging camera, and an actual temperature was measured.

Figure 9:
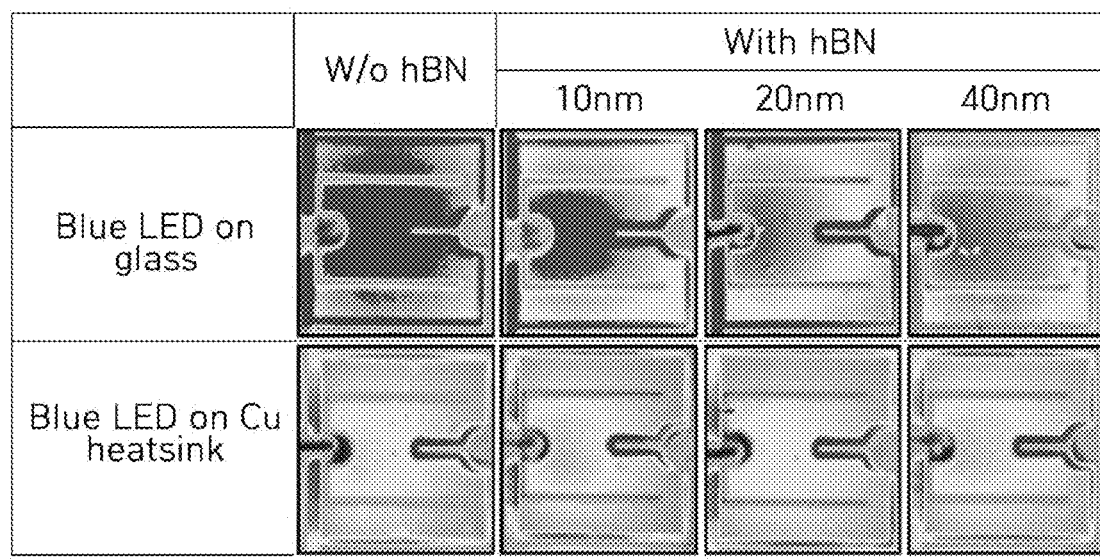
FIG. 9 illustrates heat distribution images of blue LED packages according to the present invention.

FIG. 9 illustrates heat distribution images of a blue LED packaged on glass without an hBN layer and blue LEDs packaged on glass with hBN layers having thicknesses of 10 nm, 20 nm, and 30 nm and heat distribution images of a blue LED attached with a Cu heat sink without an hBN layer and blue LEDs attached with a Cu heat sink with hBN layers having thicknesses of 10 nm, 20 nm, and 30 nm.

In all of the LED packages manufactured as shown in FIG. 7 and the LED packages manufactured as shown in FIG. 8, it can be seen that, when the hBN layer is present, a heat distribution rate and a heat dissipation amount are increased as compared with a case in which the hBN layer is not present. It can be seen that there are differences in heat distribution and heat dissipation amount according to the thicknesses of the hBN layers. Of course, as can be expected, it can be seen that a heat distribution rate and a heat dissipation amount in the case of the package attached to the Cu heat sink are greater than those of the package manufactured on the glass without the heat sink.

Figure 10A:
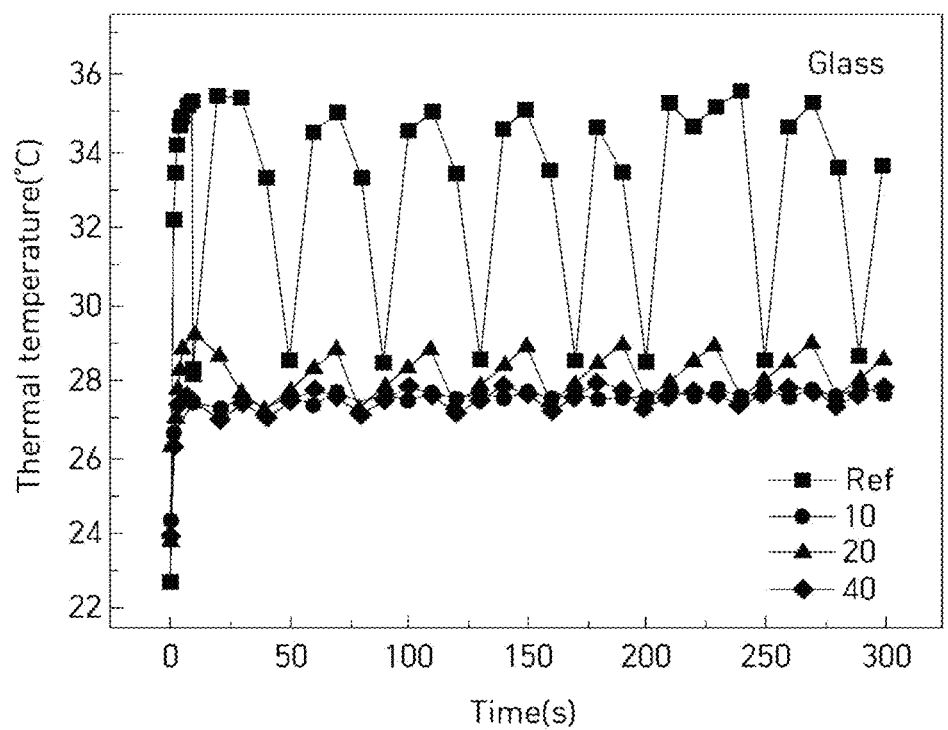
FIGS. 10A and 10B are graphs showing a temperature over time of blue LED packages according to the present invention.
Figure 10B:
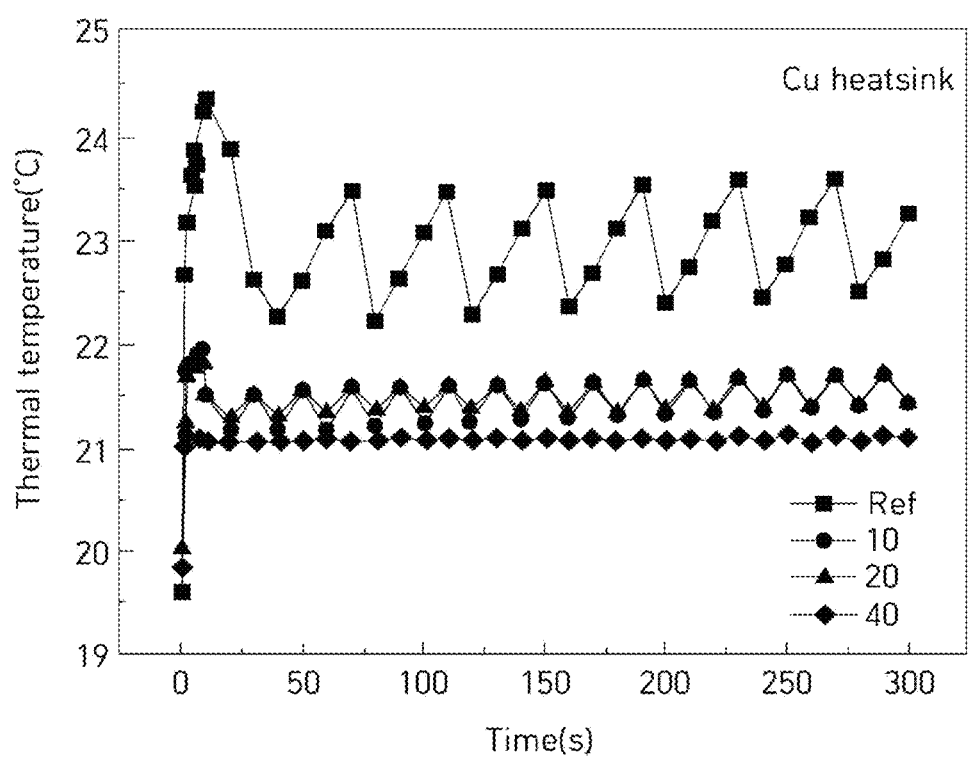

FIGS. 10A and 10B illustrate actually measured temperatures. A time trajectory of a measured temperature of a conventional blue LED is indicated by "Ref," and there is a large fluctuation between about 28° C. and about 35° C., which indicates thermal instability. On the other hand, in the case of the blue LED to which the hBN layer according to the present invention is applied, not only an average temperature is reduced, but also a fluctuation is greatly reduced, which indicates thermal stability. In the case of the present invention, as the thickness of the hBN layer is increased, a fluctuation is further reduced, thereby increasing thermal stability.

Since a semiconductor device according to the present invention includes hBN with a two-dimensional nanostructure, heat generated at each interface inside the element is effectively distributed or radiated, thereby improving a heat dissipation property. Due to the improvement in the heat dissipation property, the possibility of carrier loss or destruction of a device structure due to heat is reduced to increase the efficiency of the semiconductor device and a device lifetime. In addition, since the two-dimensional nanostructure has a small volume and high processability, the two-dimensional nanostructure is useful for improving properties of micro-sized or high-power semiconductor devices.

While the configuration of the present invention has been described above with reference to the accompanying drawings, the above description is merely an example, and various modifications and changes may be made therein by those of ordinary skill in the art without departing from the spirit or scope of the present invention. Accordingly, the scope of the present invention should not be construed as being limited to the above-described embodiments and should be defined by the appended claims.

What is claimed is:

1. A light-emitting diode (LED) or field-effect transistor (FET) semiconductor device with a high heat dissipation property using hexagonal boron nitride (hBN), comprising:
   a substrate of the LED or FET semiconductor device having a first surface and a second surface;
   a semiconductor layer formed on the first surface of the substrate of the LED or FET semiconductor device, the semiconductor layer being made of at least one material selected from a compound formed by bonding zinc to oxygen or selenide and a compound formed by bonding aluminum, gallium, or indium to nitrogen, arsenic, or phosphorus;
   an hBN layer having a 2-dimensional nanostructure, being formed on at least one surface of the first surface and the second surface of the substrate of the LED or FET semiconductor device, and having a thickness of 10 Å to 200 mm; and
   a heat sink positioned on the second surface of the substrate of the LED or FET semiconductor device.

2. The semiconductor device of claim 1, wherein the hBN layer is formed on the first surface of the substrate of the LED or FET semiconductor device,
   the hBN layer formed on the first surface being formed between the first surface of the substrate of the LED or FET semiconductor device and the semiconductor layer.

3. The semiconductor device of claim 1, wherein the hBN layer is formed on the second surface of the substrate of the LED or FET semiconductor device,
   the hBN layer formed on the second surface being formed between the second surface of the substrate of the LED or FET semiconductor device and the heat sink.

4. The semiconductor device of claim 1, wherein the hBN layer is formed on each of the first surface and the second surface of the substrate of the LED or FET semiconductor device,
   the hBN layer formed on the first surface being formed between the first surface of the substrate of the LED or FET semiconductor device and the semiconductor layer, and
   the hBN layer formed on the second surface being formed between the second surface of the substrate of the LED or FET semiconductor device and the heat sink.

5. The semiconductor device of claim 1, wherein the hBN layer has one of a single layer structure and a multi-layer structure.

6. The semiconductor device of claim 1, wherein the hBN layer comprises a plurality of hBN regions and a plurality of insulating regions positioned between the plurality of hBN regions,
   the plurality of hBN regions and the plurality of insulating regions being laterally disposed on a surface of the substrate of the LED or FET semiconductor device.

7. The semiconductor device of claim 1, wherein the semiconductor layer is an optoelectronic semiconductor made of a material comprising at least one selected from among atoms of Groups II, III, IV, and V.

8. The semiconductor device of claim 1, wherein the semiconductor layer is an optoelectronic semiconductor formed to have one of bulk, thin film, quantum well, nano wire, and quantum dot structures.

9. The semiconductor device of claim 1, wherein the hBN layer has one structure of a single crystalline structure and a polycrystalline structure.

10. The semiconductor device of claim 1, wherein the hBN layer is formed on the substrate of the LED or FET semiconductor device through a transfer method.

11. The semiconductor device of claim 1, wherein the heat sink is made of one material selected from among a metal and a ceramic-based material.

12. A method of manufacturing a light-emitting diode (LED) or field-effect transistor (FET) semiconductor device with a high heat dissipation property using hexagonal boron nitride (hBN), the method comprising:
    forming a semiconductor layer, using at least one material selected from a compound formed by bonding zinc to oxygen or selenide and a compound formed by bonding aluminum, gallium, or indium to nitrogen, arsenic or phosphorus on a first surface of a substrate of the LED or FET semiconductor device having the first surface and a second surface;
    forming an hBN layer having a 2-dimensional nanostructure on at least one surface of the first surface and the second surface of the substrate of the LED or FET semiconductor device, the hBN layer having a thickness of 10 Å to 200 nm; and
    attaching a heat sink to the second surface of the substrate of the LED or FET semiconductor device.

13. The method of claim 12, wherein, in the forming of the hBN layer, the hBN layer is formed between the first surface of the substrate of the LED or FET semiconductor device and the semiconductor layer.

14. The method of claim 12, wherein, in the forming of the hBN layer, the hBN layer is formed between the second surface of the substrate of the LED or FET semiconductor device and the heat sink.

15. The method of claim 12, wherein, in the forming of the hBN layer, the hBN layer is formed between the first surface of the substrate of the LED or FET semiconductor device and the semiconductor layer and between the second surface of the substrate of the LED or FET semiconductor device and the heat sink.

16. The method of claim 12, wherein, in the forming of the hBN layer, a plurality of hBN regions are formed to be laterally disposed on a surface of the substrate of the LED or FET semiconductor device with insulating regions interposed therebetween.

17. The method of claim 12, wherein, in the forming of the hBN layer, the hBN layer is formed on the substrate of the LED or FET semiconductor device through a transfer method.

\* \* \* \* \*